United States Patent
Solberg

[11] Patent Number: 5,917,701
[45] Date of Patent: Jun. 29, 1999

[54] HEAT SINK HOLD-DOWN CLIP

[75] Inventor: Terry B. Solberg, Golden Valley, Minn.

[73] Assignee: Artesyn Technologies, Inc., Eden Prairie, Minn.

[21] Appl. No.: 08/964,628

[22] Filed: Nov. 5, 1997

[51] Int. Cl.⁶ .................................................. H05K 7/20
[52] U.S. Cl. ........................ 361/704; 176/16.3; 267/160; 361/720
[58] Field of Search ............................ 24/295, 458, 573, 24/625; 165/80.2, 80.3, 185; 174/16.3; 257/706, 707, 712, 713, 718, 719, 726, 727; 267/158, 160, 164, 181; 361/704, 707, 710, 719, 720

[56] References Cited

U.S. PATENT DOCUMENTS

| 3,670,215 | 6/1972 | Wilkens et al. | 317/234 R |
|---|---|---|---|
| 4,388,967 | 6/1983 | Breese | 165/80 B |
| 4,403,102 | 9/1983 | Jordan et al. | 174/16 HS |
| 4,481,525 | 11/1984 | Calabro et al. | 357/81 |
| 4,625,260 | 11/1986 | Jordan et al. | 361/386 |
| 4,890,196 | 12/1989 | Hinshaw | 361/704 |
| 4,972,294 | 11/1990 | Moses, Jr. et al. | 361/386 |
| 5,282,111 | 1/1994 | Hopfer | 361/704 |
| 5,309,979 | 5/1994 | Brauer | 165/80.2 |
| 5,311,395 | 5/1994 | McGaha et al. | 361/720 |
| 5,343,362 | 8/1994 | Solberg | 361/710 |
| 5,373,099 | 12/1994 | Boitard et al. | 174/16.3 |
| 5,422,789 | 6/1995 | Fisher et al. | 361/719 |
| 5,548,482 | 8/1996 | Hatauchi et al. | 361/720 |
| 5,586,005 | 12/1996 | Cipolla et al. | 361/719 |

OTHER PUBLICATIONS

IBM Tech. Disl. Bulletin "Surface–Mounted Power Transistor and Heat Sink", vol. 28, No. 12, pp. 5502–5503, May 1986.

Primary Examiner—Gregory Thompson
Attorney, Agent, or Firm—Kinney & Lange, P.A.

[57] ABSTRACT

A fastener for mounting a heat sink to a circuit board. The heat sink has a lower surface, at least one groove in the lower surface defining first and second surfaces extending substantially normal to the lower surface, and a lock recess on each of the first and second surfaces. The circuit board has a plurality of openings in a mounting surface thereof The fastener includes a body having a main portion. A spring clip extends in a first direction from the main portion into the groove and is biased to engage the first and second surfaces of the heat sink. A plurality of latches on the spring clip engage the lock recesses when the spring clip engages the first and second surfaces of the heat sink. A plurality of anchor lugs extend in a second direction from the main portion, opposite the first direction, to be received in respective openings in the board to rigidly attach the fastener to the circuit board. Preferably, the anchor lugs are of differing lengths and configurations to permit assembly of the clip to different sized circuit boards. Also preferably, engagement protrusions on the clip engage a concave surface on the heat sink.

16 Claims, 4 Drawing Sheets

HEAT SINK HOLD-DOWN CLIP

BACKGROUND OF THE INVENTION

This invention relates to clips for mounting heat sinks to circuit boards.

Many circuit devices, including integrated chips, generate heat during operation which must be dissipated to avoid damage to the circuit device. In many cases, heat generated by the circuit devices is adequately dissipated through a ground plane of the circuit board to which the circuit device is connected, or into the environment surrounding the circuit board. Where the density of the operating circuit devices is so high that heat cannot be adequately dissipated through circuit connections or into the atmosphere, it is common to employ heat sinks to aid in dissipation of heat to the environment. Moreover, it is common to mount circuit devices directly to heat sinks which themselves are mounted to the circuit board.

Heat sinks are constructed of thermally conductive material such as copper or aluminum, and include fins to increase the surface area of the heat sink to increase heat transfer from the heat sink to the air surrounding it. Heat sinks are commonly mounted to circuit boards by surface mount techniques. Pads on the circuit board provide a solder mount for the heat sink or a clip holding the heat sink. A circuit component is mounted to the heat sink and the component and heat sink are mounted to the board, the heat sink being mounted to the pads to dissipate heat from the circuit component attached thereto. In some cases, the heat sink or pads are connected to a ground plane in the circuit board to additionally dissipate heat from the circuit board.

One example of surface-mounted heat sinks may be found in the Jordan et al. U.S. Pat. No. 4,625,260. In Jordan et al., a surface mount clip fastener is soldered to pads on the circuit board, and a heat sink is mounted to the clip. One of the problems with the Jordan et al. approach is that mounting the clip fastener requires an additional solder step of the surface mount. A jig or other holding mechanism is required to hold the clip in place while soldering the clip fastener to the pads, thereby adding to the fabrication costs. Moreover, permanently mounting the clip fastener to the circuit board, such as by surface mount solder connection as in Jordan et al., obscures portions of the circuit board and pad from inspection, thereby rendering final inspection and test of the circuit board more difficult. Consequently, there is a need for a clip fastener for mounting a heat sink to a circuit board that permits temporary mounting of the clip fastener to the board to permit inspection and testing, and that permits subsequent permanent attachment without use of a jig or other holding mechanism.

BRIEF SUMMARY OF THE INVENTION

In accordance with one aspect of the present invention, a clip fastener is provided for mounting a heat sink to a circuit board. The fastener includes a body having a main portion, first attachment means for detachably engaging the heat sink, and second attachment means for rigidly attaching the body to the circuit board. The first and second attachment means extend from the main portion in opposite directions.

In one form of the invention, the first attachment means comprises a spring clip extending in a first direction from the main portion and lock means on the spring clip for locking the spring clip to the heat sink. The lock means may include a plurality of latches on the spring clip to engage a lock recess on the heat sink when the heat sink is attached to the fastener by the spring clip.

The heat sink preferably includes one or more grooves in a lower surface of the heat sink. The grooves define first and second surfaces extending substantially normal to the lower surface. The spring clip of the fastener has first and second spring arms extending from the main portion of the fastener and into the grooves, the spring arms being biased to engage the respective first and second surfaces of the heat sink. In a preferred form, the heat sink has at least two grooves extending longitudinally in the lower surface of the heat sink, the grooves forming a land portion of the lower surface between them. The fastener further includes engagement means, such as spring protrusions extending from the main portion, to engage the land portion.

In a preferred form of the invention, the lock recess is in each of the first and second surfaces of the groove, and at least one latch extends from each respective spring arm to engage the recess in the respective first or second surface, thereby locking the fastener to the heat sink.

Preferably, the land includes a concave surface between the first and second grooves. The engagement means comprises at least one spring-biased protrusion having an end edge smaller than an end of the concave surface of the heat sink and at least two side edges extending at opposite angles from the end edge so that the side edges engage respective edges of the concave surface.

In another form of the invention, the second attachment means comprises at least two anchor lugs arranged in a pattern to be received by at least a corresponding two apertures in the circuit board. Each anchor lug has a shoulder arranged to engage a first surface of a circuit board and a latch arranged to engage a second opposite surface of the circuit board. In one embodiment of this form of the invention, the shoulder and latch of at least a first of the anchor lugs are spaced a first distance, and the shoulder and latch of at least a second of the anchor lugs are spaced a second, greater, distance. The fastener is universally mountable to circuit boards having thicknesses substantially equal to either the first or second distance by inserting the anchor lugs into apertures in the mounting surface of the circuit board so that the latches of at least one of the anchor lugs engages the second surface of the circuit board.

In accordance with another aspect of the present invention, a fastener is provided for mounting a heat sink to a circuit board. The heat sink is of a character having a lower surface, at least one groove in the lower surface defining first and second surfaces extending substantially normal to the lower surface, and a lock recess on each of the first and second surfaces. The circuit board is of a character having a plurality of openings in a mounting surface thereof. The fastener includes a body having a main portion. A thermally conductive spring clip extends in a first direction from the main portion. The spring clip is biased to engage the first and second surfaces of the heat sink. A plurality of latches on the spring clip engages the lock recesses when the spring clip engages the first and second surfaces of the heat sink. A plurality of anchor lugs extend in a second direction from the main portion, the second direction being opposite the first direction. The anchor lugs are disposed and arranged with respect to the openings in the mounting surface of the circuit board as to be received in respective openings to rigidly attach the body to the circuit board.

In this second aspect of the invention, the spring clip is preferably receivable in the groove in the heat sink and has first and second spring arms extending from the main portion and into the groove. The spring arms are biased to engage the respective first and second surfaces of the heat sink. At least one of the latches is carried on each of the spring arms.

The heat sink is preferably further of the character having at least two longitudinal grooves in the lower surface such that the first surface is an outer surface of a first groove and the second surface is an outer surface of a second groove. The lower surface of the heat sink includes a land portion between the first and second grooves. The fastener further includes engagement means extending from the main portion to engage the land portion of the lower surface of the heat sink. Preferably, the engagement means includes spring protrusions extending from the main portion and biased against the land portion of the heat sink when the first and second spring arms engage the respective first and second surfaces of the heat sink.

Preferably, the land portion includes a concave surface between the first and second grooves. The engagement means comprises at least one spring-biased protrusion having an end edge smaller than an end of the concave surface of the heat sink and at least two side edges extending at opposite angles from the end edge so that the side edges engage respective edges of the concave surface.

In this second aspect of the invention, there are preferably at least two anchor lugs arranged in a pattern to be received by at least a corresponding two apertures in the circuit board. Each anchor lug has a shoulder arranged to engage a first surface of a circuit board and a latch arranged to engage a second opposite surface of the circuit board. In one embodiment of this aspect of the invention, the shoulder and latch of at least a first of the anchor lugs are spaced a first distance, and the shoulder and latch of at least a second of the anchor lugs are spaced a second, greater, distance. The fastener is universally mountable to circuit boards having thicknesses substantially equal to either the first or second distance by inserting the anchor lugs into apertures in the mounting surface of the circuit board so that the latches of at least one of the anchor lugs engages the second surface of the circuit board.

Another aspect of the present invention is directed to a universal fastener for mounting to a circuit board having a mounting surface with a plurality of apertures arranged in a pattern. The fastener has a body having a main portion and at least two anchor lugs arranged in a pattern to be received by at least a corresponding two apertures in the circuit board. Each anchor lug has a shoulder arranged to engage a first surface of a circuit board and a latch arranged to engage a second opposite surface of the circuit board. The shoulder and latch of at least a first of the anchor lugs are spaced a first distance, and the shoulder and latch of at least a second of the anchor lugs are spaced a second, greater, distance. The fastener is universally mountable to circuit boards having thicknesses substantially equal to either the first or second distance by inserting the anchor lugs into apertures in the mounting surface of the circuit board so that the latches of at least one of the anchor lugs engages the second surface of the circuit board.

DETAILED DESCRIPTION OF THE PREFERRED EMBODIMENTS

Figure 1:
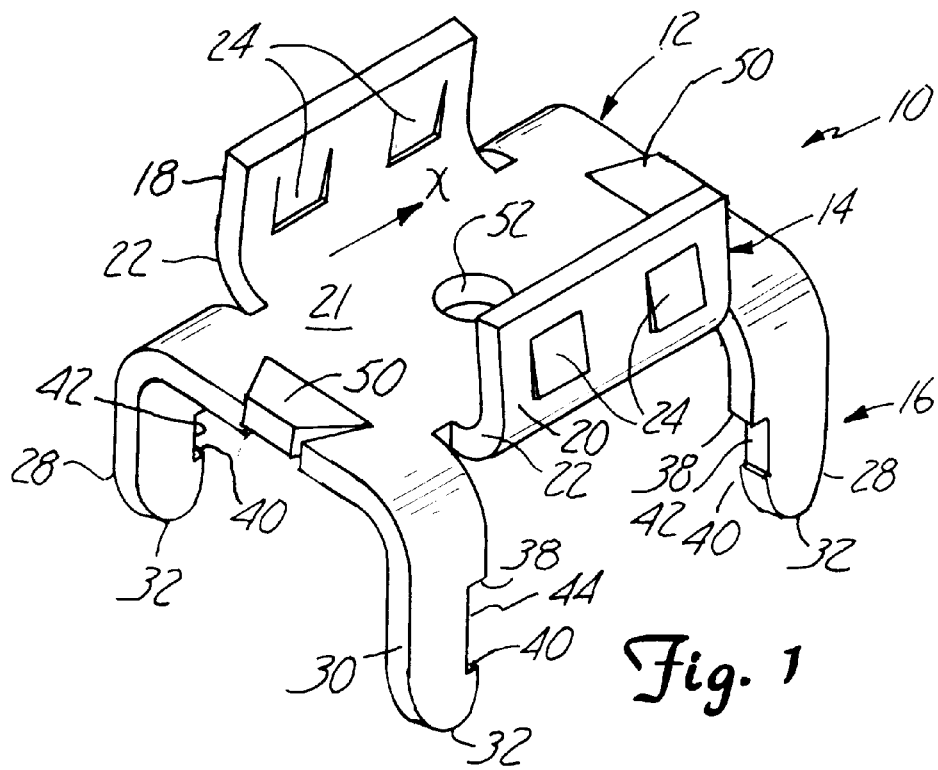
FIG. 1 is a perspective view of a heat sink hold-down clip in accordance with a first embodiment of the present invention.

FIG. 1 illustrates a first embodiment of a heat sink hold-down fastening clip 10 according to the present invention. Clip 10 comprises a unitary structure, preferably of thermally and electrically conductive material such as steel, stainless steel, copper or copper alloy. Clip 10 may be plated to accommodate later soldering, as desired. The hold-down clip includes a main body portion 12, a spring clip portion 14 and an anchor portion 16.

Clip portion 14 comprises at least two clip arms 18 and 20 protruding in a first direction upwardly from surface 21 of body 12. Clip arms 18 and 20 are integral with, and bent from, body 12 with the curved portions 22 of arms 18 and 20 providing a spring bias for the respective clip arms 18 and 20, urging the clip arms outwardly from the center of clip 10. Each clip arm 18 and 20 also includes at least one outwardly extending latch 24 formed by cutting the clip arm and bending the bottom of the latch outwardly from the clip arm to provide an outward spring bias to the latch. In the embodiment shown in FIG. 1, each clip arm 18 and 20 includes a pair of latches 24, whereas in the embodiment shown in FIG. 2, clip 10b has a single latch 24a extending along a substantial portion of the length of each clip arm 18, 20. In the case of the embodiment shown in FIG. 2, apertures 26 in latches 24a aid in the bending and spring bias of the latch.

Figure 2:
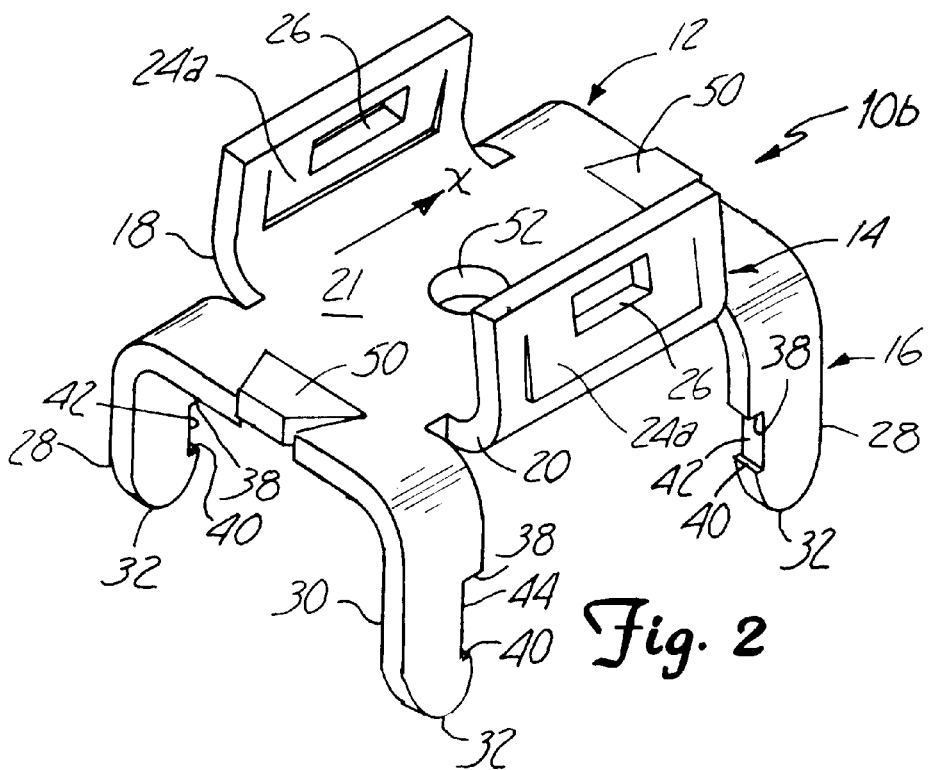
FIG. 2 is a perspective view of a heat sink hold-down clip in accordance with a second embodiment of the present invention.

In the embodiments of FIGS. 1 and 2, anchor portion 16 comprises at least two anchor lugs 28 and two anchor lugs 30 (one lug 30 is not viewable in the FIGS. 1 and 2) also integral with body 12. Lugs 28 and 30 depend downwardly in a second direction opposite clip arms 18 and 20. One lug 28 or 30 depends from each "corner" of body 12, with lugs 28 being positioned at one set of diagonally opposite corners and lugs 30 being positioned at the other set of diagonally opposite corners. Each lug 28 and 30 terminates at a tapered end 32. Lugs 30 are longer than lugs 28, so the ends 32 of lugs 30 are more distant from surface 34 (FIGS. 3 and 6) of body 12 than the ends 32 of lugs 28. Shoulders 38 face latches 40 on each lug 28 and 30 to form recesses 42 and 44, respectively. Shoulders 38 on all lugs 28 and 30 are positioned at approximately the same distance from surface 34 to define a plane so that shoulders 38 together engage an upper surface of a circuit board. Latches 40 on the longer lugs 30 are positioned approximately 0.09 inches from the respective shoulders 38, whereas latches 40 on the shorter lugs 28 are positioned approximately 0.06 inches from the respective shoulders 38. Hence, the lug recesses 42 on lugs 28 are 0.06 inches wide, whereas the lug recesses 44 on lugs 30 are 0.09 inches wide. Lug recesses 42 and 44 face each other along each side of the clip, as depicted in the FIGS. 1, 2 and 6.

Trapezoidal-shaped protrusions or tabs 50 are bent upwardly from each end of surface 21 of body portion 12, the bent protrusions 50 providing an upward spring bias to the protrusions.

Figure 3:
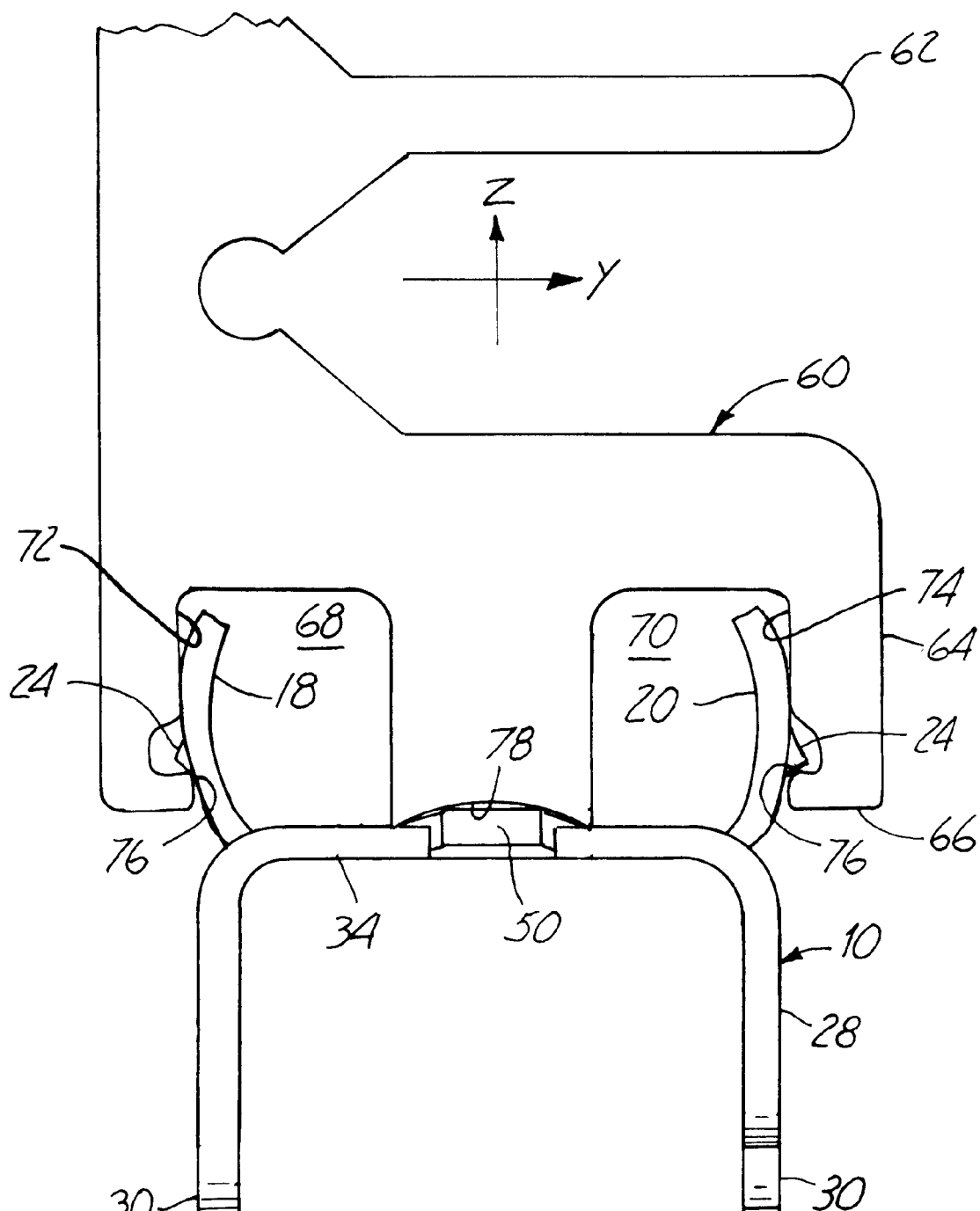
FIG. 3 is an end view of the heat sink hold-down clip shown in FIG. 1 illustrating the mounting of a heat sink to the clip.
Figure 5:
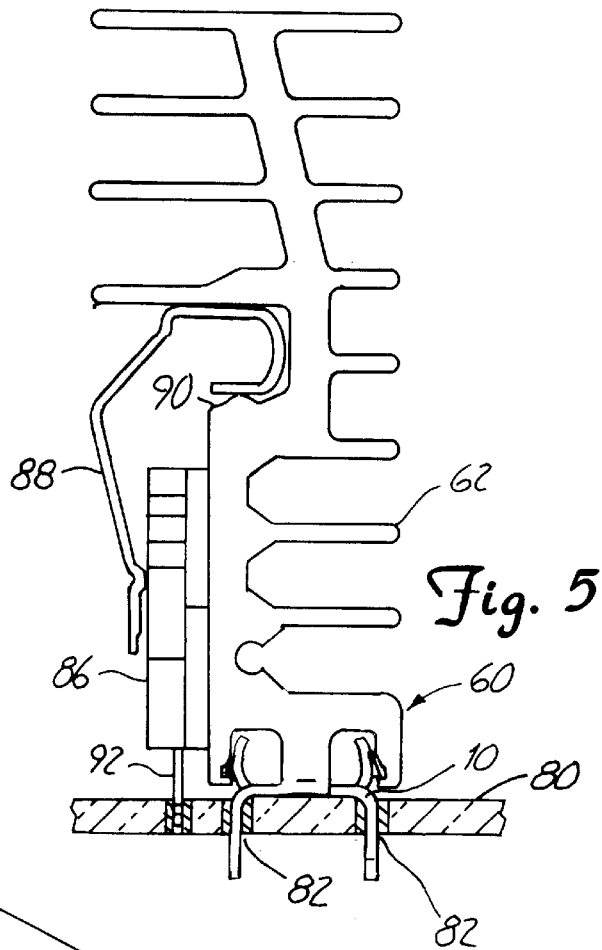
FIG. 5 is a partly cut-away side view, illustrating the assembly of the heat sink to the clip shown in FIG. 1 and of the clip to a circuit board.
Figure 4:
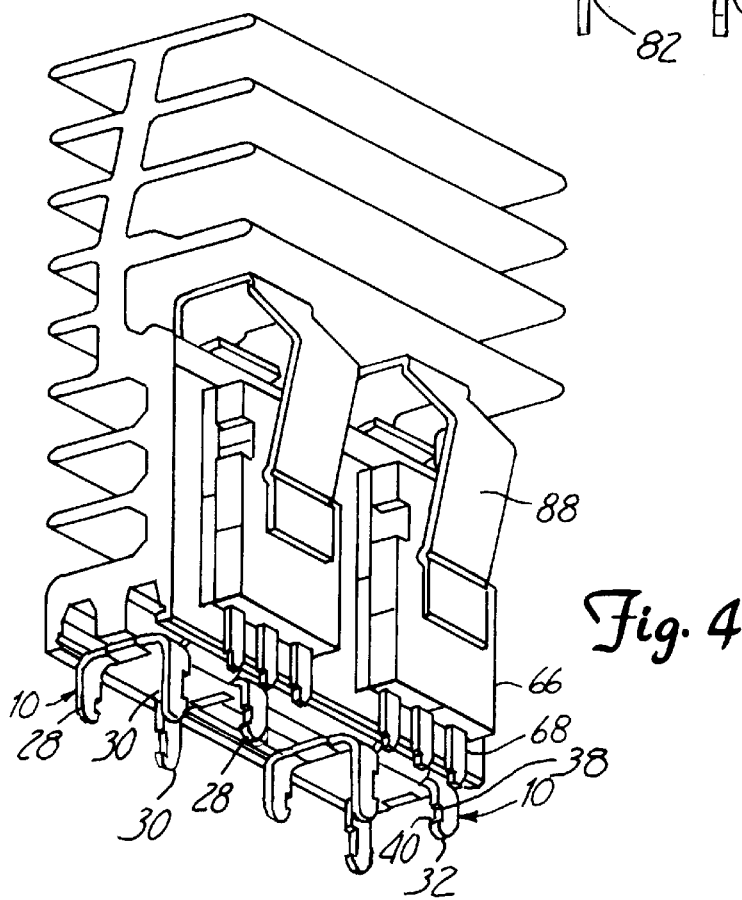
FIG. 4 is a perspective view.

As shown particularly in FIGS. 3–5, heat sink 60 includes a plurality of heat disbursing fins 62 and a base portion 64. Base portion 64 includes a lower surface 66 into which a pair of longitudinal channels 68 and 70 are formed. Each channel 68, 70 includes an outer surface 72 and 74 normal to and terminating at surface 66, with an outwardly extending recess forming an inwardly protruding lip 76.

As shown in FIGS. 3–5, heat sink 60 is mounted to clip 10 by inserting arms 18 and 20 into channels 68 and 70 of heat sink 60. As shown particularly in FIG. 4, each heat sink 60 may be mounted with on or more clips 10. Arms 18 and 20 are spring biased toward the outer surfaces 72 and 74 of channels 68 and 70 so that latches 24 engage lip 76 to hold heat sink 60 in place. More particularly, arms 18 and 20 retain a somewhat curved shape so that the arms engage surfaces 72 and 74 along a line immediately adjacent the grooves forming lips 76. Consequently, the spring bias of arms 18 and 20 against surfaces 72 and 74 maintain the engagement of latches 24 against lips 76. Ideally, outer surfaces 72 and 74 follow the contour of arms 18 and 20 so the arms evenly bias against a substantial area of the surface, but as a practical matter, exact contouring of outer surfaces 72 and 74 to match arms 18 and 20 is not feasible. The engagement of arms 18 and 20 within channels 68 and 70 and the engagement of latches 24 to lips 76 assure that the heat sink is locked to clip 10 from movement in either the Z or Y direction shown in FIG. 3.

Heat sink 60 includes a concave land 78 between channels 68 and 70. The ends of spring biased protrusions or tabs 50 have a width smaller than the width of concave land 78 so that the side edges of each protrusion 50 extend at opposite angles from the end edge of the protrusion to engage the surface of heat sink 60 at land 78, thereby locking clip 10 to the heat sink by the bias force of arms 18 and 20, the bias force of protrusions 50 and the locking action of latches 24 against lip 76. The locking action of protrusions 50 to land 78 assures that the heat sink is locked to clip 10 from movement in the X direction (FIGS. 1 and 2) and about the Z axis.

As described in my U.S. Pat. No. 5,343,362 granted Aug. 30, 1994 for "Heat Sink Assembly" and assigned to the same assignee as the present invention, circuit component 86 may be directly mounted to heat sink 60 by clip 88 nested to a receiver 90 in the heat sink. Heat from circuit component 86 is dissipated directly into heat sink 60 for dissipation into the atmosphere.

In use, and as shown in FIGS. 3–6, heat sink 60 is mounted to clip 10 and component 86 attached to heat sink 60 as described above. Clip 10 and component 86 are ready for mounting to circuit board 80. Clip 10 is mounted to circuit board 80 by a latch arrangement formed by shoulder 38 and latch 40 of each of at least two lugs 28 or 30. As the leads 92 of component 86 are inserted into respective plated-through apertures in board 80, the ends 32 of each lug 28 or 30 self-align to plated-through apertures 82 to accommodate entry of the lugs into the apertures. Apertures 82 are preferably plated-through holes that may optionally be connected to a ground plane or other heat collecting and/or dissipation plane of circuit board 80. Latches 40 are sized relative to shoulders 38 and apertures 82 to permit latches 40 to pass through apertures 82 so that a pair of latches 40 of either lugs 28 or 30 engage the bottom surface of the board. The upper surface of the circuit board engages shoulders 38 of all the clips when the lugs are fully assembled to the circuit board. As the clip becomes fully seated to the circuit board the metal of the latch engages the metal of the plated-through aperture 82 producing a distinctive click sound, which is recognized by the assembler to indicate the assembly is completed. When fully seated, the latches engaging the bottom surface of the board bias the board so that the top surface of circuit board 80 engages shoulders 38 of all lugs 28 and 30 is spaced a design distance (such as 0.1 inches) from surface 34 of the clip.

Figure 6:
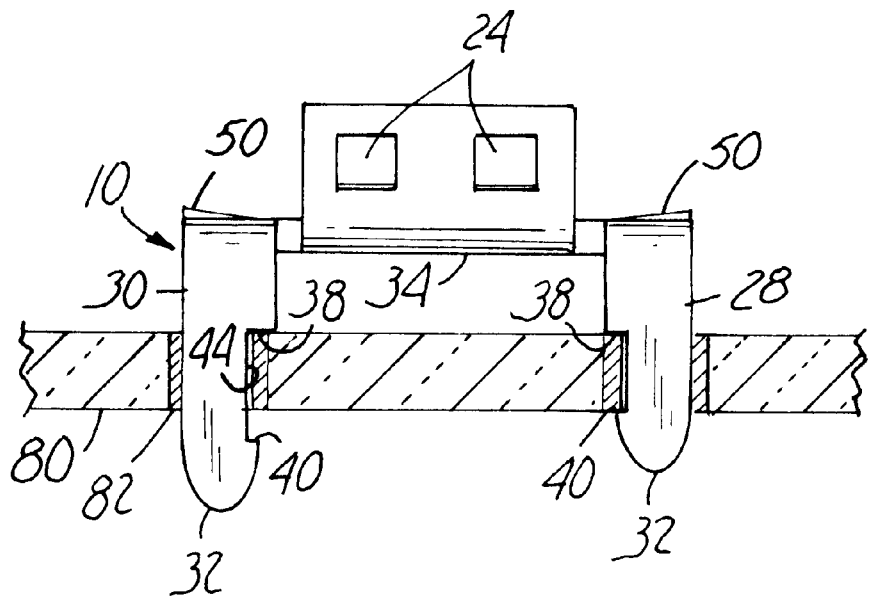
FIG. 6 is an enlarged partly cut-away side view, as in FIG. 5, illustrating details of the connection of the clip to a circuit board.

The bottom surface of board 80 is engaged by the latches 40 on only one pair of lugs 28 or 30. Latches 40 on lugs 28 are spaced 0.06 inches from shoulders 38 to accommodate a standard 0.06 inch thick circuit board, while latches 40 on lugs 30 are spaced 0.09 inches from shoulders 38 to accommodate a standard 0.09 inch thick circuit board. Consequently, the latch arrangement for mounting clip 10 to board 80 is a universal latch arrangement accommodating two standard thicknesses of circuit boards. When assembled to a standard 0.06 inch board, as shown in FIG. 6, latches 40 on lugs 28 engage the board and latches 40 on lugs 30 extend past the bottom surface of the board. When assembled to a standard 0.09 inch board, latches 40 of lugs 30 engage the board and latches 40 of lugs 28 are retained within apertures 82 receiving lugs 30.

With at least two latches 40 biasing board against all shoulders 38, clip 10 is rigidly, but removably, mounted to the board. Consequently, heat sink 60 and component 86 may be assembled and mounted to the circuit board and inspected and tested before final solder attachment of the heat sink and component. Final solder attachment of the anchor lugs 28 and 30 of clip 10 and of leads 92 of component 86 to the board need be performed only after final inspection and testing is completed. Conveniently, if clip 10 is connected to a ground plane or heat dispersion plane of circuit board 80, heat from the circuit board may be dissipated through the clip, in addition to heat from component 86, through the lugs and protrusions 50, into the heat sink for dissipation to the atmosphere.

Figure 7:
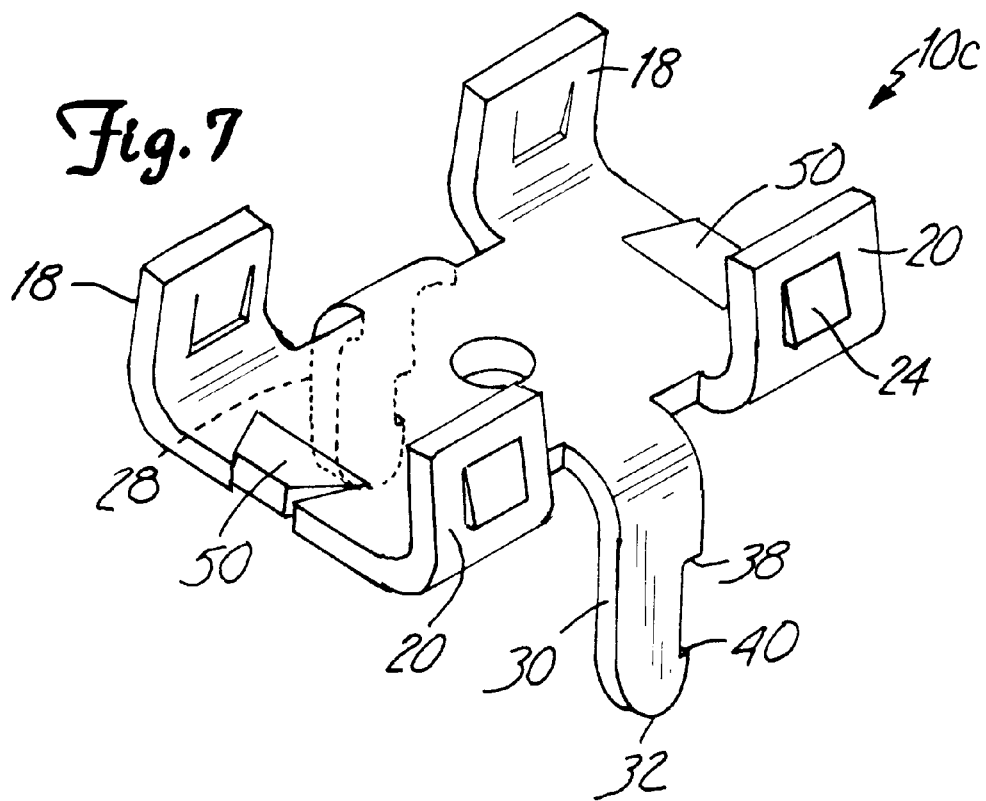
FIG. 7 is a perspective view of a heat sink hold-down clip in accordance with a third embodiment of the present invention.

FIG. 7 illustrates another embodiment of a clip 10c of the present invention employing four clip arms 18 and 20 each having a latch 24 to engage lip 76 on heat sink 60, as in FIG. 1. In the case of the embodiment of FIG. 7, there are two anchor lugs 28 and 30, each with a shoulder 38 to engage an upper surface of circuit board 80 and a latch 40 to engage a lower surface of circuit board 80. In this case, however, where a single clip 10c is employed to mount a heat sink, lugs 28 and 30 are identical in configuration, arranged to accommodate a single sized board 80. Therefore, shoulders 38 and lugs 40 of both lugs are spaced to accommodate the board size, 0.06 inches for 0.06 inch boards and 0.09 inches for 0.09 inch boards. However, where two or more clips 10c are employed to mount a single heat sink, each clip 10c may employ universal anchor lugs 28 and 30, with lug 28 sized to accommodate a 0.6 inch board and lugs 30 sized to accommodate a 0.9 inch board. More particularly, it is adequate that a heat sink be mounted using only two anchor lugs sized for the board. Therefore, where two clips 10c are employed, both clips may be designed for use with two sizes of boards.

Although the present invention has been described in connection with a temporary mount of a head sink and component to a circuit board, in practice users may find the latch connection to the circuit board adequate, without need for solder connection. While two latch connections sized to the board may be adequate, four lugs are sized to the board provide an even stronger connection of the clip to the board, eliminating the need for a solder connection altogether.

Although the present invention has been described with reference to preferred embodiments, workers skilled in the art will recognize that changes may be made in form and detail without departing from the spirit and scope of the invention.

I claim:

1. A fastener for mounting a heat sink to a circuit board comprising a body having:

a main portion;

first attachment means extending from the main portion for detachably engaging the heat sink;

second attachment means extending from the main portion for rigidly attaching the body to the circuit board; and engagement means extending from the main portion for engaging a concave surface of the heat sink, the engagement means comprises at least one spring-biased protrusion having an end edge and at least two side edges extending at opposite angles from the end edge so that the side edges engage respective edges of the concave lower surface of the heat sink when the fastener engages the heat sink.

2. The fastener of claim 1, wherein the first attachment means comprises a spring clip extending in a first direction from the main portion and lock means on the spring clip for locking the spring clip to the heat sink.

3. The fastener of claim 2, wherein the lock means comprises at least one lock latch on the spring clip for engaging a lock recess on the heat sink when the heat sink is attached to the fastener by the spring clip.

4. The fastener of claim 1, wherein the second attachment means comprises a plurality of anchor lugs extending from the main portion so disposed and arranged to be received in respective apertures in the circuit board when the fastener is attached to the circuit board.

5. The fastener of claim 4, wherein there are at least two anchor lugs arranged in a pattern, each of the anchor lugs having a shoulder and an anchor latch, the shoulder and anchor latch of at least a first of the anchor lugs being spaced apart by a first distance, and the shoulder and anchor latch of at least a second of the anchor lugs being spaced apart by a second distance, the second distance being greater than the first distance, whereby when the fastener is attached to a circuit board having a thickness between opposite first and second surfaces substantially equal to the first distance the anchor lugs extend into apertures in the circuit board so that the shoulders of the anchor lugs engage the first surface of the circuit board and the anchor latch of the first anchor lug engages the second surface of the circuit board, and when the fastener is attached to a circuit board having a thickness between opposite first and second surfaces substantially equal to the second distance the anchor lugs extend into-apertures in the circuit board so that the shoulders of the anchor lugs engage the first surface of the circuit board and the anchor latch of the second anchor lug engages the second surface of the circuit board.

6. A fastener for mounting a heat sink to a circuit board comprising a body having:

a main portion;

a spring clip having first and second spring arms extending in a first direction from the main portion for extending into respective first and second grooves in a lower surface of the heat sink to bias against a respective first outer surface of the first groove and a second outer surface of the second groove to detachably engage the heat sink;

at least one lock latch on each spring arm for engaging a lock recess on the heat sink to attach the heat sink to the fastener when the spring clip engages the heat sink;

second attachment means extending from the main portion for rigidly attaching the body to the circuit board; and engagement means extending from the main portion for engaging a land on the heat sink between the first and second grooves of the heat sink when the heat sink is attached to the fastener.

7. The fastener of claim 6, wherein the engagement means comprises at least one spring-biased protrusion having an end edge and at least two side edges extending at opposite angles from the end edge so that the side edges engage respective edges of a concave lower surface of the heat sink when the heat sink is attached to the fastener.

8. The fastener of claim 6, wherein the engagement means comprises spring tabs extending from the main portion for biasing against the surface of the land when the first and second spring arms engage the respective first and second surfaces of the heat sink.

9. The fastener of claim 8, wherein the first and second spring arms each includes at least one lock latch extending from the respective spring arm for engaging a lock recess in the respective first or second surface of the respective groove when the first and second spring arms engage the respective first and second surfaces of the heat sink, the first and second spring arms being so disposed and arranged to bias the lock latches into the respective recess when the heat sink is attached to the fastener.

10. The fastener of claim 6, wherein the first and second spring arms each includes at least one lock latch extending from the respective spring arm for engaging a lock recess in the respective first or second surface of the respective groove when the first and second spring arms engage the respective first and second surfaces of the heat sink, the first and second spring arms being so disposed and arranged to bias the lock latches into the respective lock recess, thereby locking the fastener to the heat sink when the heat sink is attached to the fastener.

11. The fastener of claim 6, wherein the second attachment means comprises a plurality of anchor lugs extending from the main portion so disposed and arranged to be received in respective apertures in the circuit board when the fastener is attached to the circuit board.

12. The fastener of claim 11, wherein there are at least two anchor lugs arranged in a pattern, each of the anchor lugs having a shoulder and an anchor latch, the shoulder and anchor latch of at least a first of the anchor lugs being spaced apart by a first distance, and the shoulder and anchor latch of at least a second of the anchor lugs being spaced apart by a second distance, the second distance being greater than the first distance, whereby when the fastener is attached to a circuit board having a thickness between opposite first and second surfaces substantially equal to the first distance the anchor lugs extend into apertures in the circuit board so that the shoulders of the anchor lugs engage the first surface of the circuit board and the anchor latch of the first anchor lug engages the second surface of the circuit board, and when the fastener is attached to a circuit board having a thickness between opposite first and second surfaces substantially equal to the second distance the anchor lugs extend into apertures in the circuit board so that the shoulders of the anchor lugs engage the first surface of the circuit board and the anchor latch of the second anchor lug engages the second surface of the circuit board.

13. A fastener for attachment to a heat sink and to a circuit board to mount the heat sink to the circuit board, the fastener comprising a body having:

a main portion;

a spring clip having first and second spring arms extending in a first direction from the main portion for reception within a groove in a lower surface of the heat sink to bias against and detachably engage respective first and second surfaces in the groove;

at least one lock latch on each spring arm for engaging respective lock recesses in the respective first and second surfaces to thereby attach the fastener to the heat sink when the spring arms engage the first and second surfaces of the heat sink;

engagement means extending from the main portion for engaging a land portion of the lower surface between the longitudinal grooves of the heat sink when the fastener is attached to the heat sink; and a plurality of anchor lugs extending in a second direction from the main portion, the second direction being opposite the first direction, the anchor lugs being so disposed and arranged with respect to apertures in the circuit board as to be received in respective apertures to rigidly attach the body to the circuit board.

14. The fastener of claim 13, wherein the engagement means comprises at least one spring-biased protrusion having an end edge and at least two side edges extending at opposite angles from the end edge so that the side edges engage respective edges of a concave surface of the land portion between the first and second grooves when the fastener is attached to the heat sink.

15. The fastener of claim 13, wherein there are at least two anchor lugs arranged in a pattern, each of the anchor lugs having a shoulder and an anchor latch, the shoulder and anchor latch of at least a first of the anchor lugs being spaced apart by a first distance, and the shoulder and anchor latch of at least a second of the anchor lugs being spaced apart by a second distance, the second distance being greater than the first distance, whereby when the fastener is attached to a circuit board having a thickness between opposite first and second surfaces substantially equal to the first distance the anchor lugs extend into apertures in the circuit board so that the shoulders of the anchor lugs engage the first surface of the circuit board and the anchor latch of the first anchor lug engages the second surface of the circuit board, and when the fastener is attached to a circuit board having a thickness between opposite first and second surfaces substantially equal to the second distance the anchor lugs extend into apertures in the circuit board so that the shoulders of the anchor lugs engage the first surface of the circuit board and the anchor latch of the second anchor lug engages the second surface of the circuit board.

16. A universal fastener for mounting to a circuit board, the fastener comprising a body having:

a main portion; and at least two anchor lugs extending from the main portion and arranged in a pattern, each of the anchor lugs having a shoulder and an anchor latch, the shoulder and anchor latch of at least a first of the anchor lugs being spaced apart by a first distance, and the shoulder and anchor latch of at least a second of the anchor lugs being spaced apart by a second distance, the second distance being greater than the first distance, whereby when the fastener is mounted to a circuit board having a thickness between opposite first and second surfaces substantially equal to the first distance the anchor lugs extend into apertures in the circuit board so that the shoulders of the anchor lugs engage the first surface of the circuit board and the anchor latch of the first anchor lug engages the second surface of the circuit board, and when the fastener is mounted to a circuit board having a thickness between opposite first and second surfaces substantially equal to the second distance the anchor lugs extend into apertures in the circuit board so that the shoulders of the anchor lugs engage the first surface of the circuit board and the anchor latch of the second anchor lug engages the second surface of the circuit board.

* * * * *